United States Patent
Shinoda

(10) Patent No.: US 6,868,223 B2
(45) Date of Patent: Mar. 15, 2005

(54) ILLUMINATION APPARATUS, EXPOSURE APPARATUS USING THE SAME AND DEVICE FABRICATION METHOD

(75) Inventor: Kenichiro Shinoda, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 316 days.

(21) Appl. No.: 10/142,498

(22) Filed: May 10, 2002

(65) Prior Publication Data

US 2003/0021579 A1 Jan. 30, 2003

(30) Foreign Application Priority Data

May 11, 1921 (JP) ........................................ 2001-142463

(51) Int. Cl.$^7$ .............................. G02B 6/10; G02B 6/00
(52) U.S. Cl. ......................... 385/146; 385/147; 385/15; 385/31; 385/32; 385/33; 385/34; 385/35; 385/123; 362/551
(58) Field of Search ................................ 385/901, 146, 385/147, 123, 15, 31–35; 355/70, 67; 362/268, 551

(56) References Cited

U.S. PATENT DOCUMENTS

| | | | | |
|---|---|---|---|---|
| 4,939,630 A | * | 7/1990 | Kikuchi et al. | 362/268 |
| RE34,634 E | * | 6/1994 | Konno et al. | 362/268 |
| 5,459,547 A | * | 10/1995 | Shiozawa | 355/67 |
| 5,634,704 A | * | 6/1997 | Shikama et al. | 353/31 |
| 5,636,003 A | * | 6/1997 | Tanitsu et al. | 355/67 |
| 5,680,257 A | * | 10/1997 | Anderson | 359/727 |
| 5,719,704 A | * | 2/1998 | Shiraishi et al. | 359/558 |
| 5,798,824 A | * | 8/1998 | Kudo | 355/67 |
| 5,991,009 A | * | 11/1999 | Nishi et al. | 355/70 |
| 5,991,088 A | * | 11/1999 | Mizouchi | 359/649 |
| 6,042,237 A | * | 3/2000 | De Vaan et al. | 353/38 |

(List continued on next page.)

FOREIGN PATENT DOCUMENTS

| | | |
|---|---|---|
| JP | 10-270312 | 10/1998 |
| JP | 11-87232 | 3/1999 |
| JP | 11-354424 | 12/1999 |
| JP | 2000-260698 | 9/2000 |
| JP | 2001-250762 | 9/2001 |
| JP | 2001-264696 | 9/2001 |
| JP | 2001-284236 | 10/2001 |

OTHER PUBLICATIONS

Patent Abstracts of Japan—Publication No. 2001-284236, date of publication Oct. 12, 2001.

Patent Abstracts of Japan—Publication No. 2000-260698, date of publication Sep. 22, 2000.

Patent Abstracts of Japan—Publication No. 11-354424, date of publication Dec. 24, 1999.

*Primary Examiner*—Karl D. Frech
*Assistant Examiner*—Daniel Walsh
(74) *Attorney, Agent, or Firm*—Morgan & Finnegan, L.L.P.

(57) ABSTRACT

An illumination apparatus for using a beam emitted from a light source to illuminate an object area includes a condensing optical system for condensing the beam emitted from the light source, and a reflection type optical integrator located between the condensing optical system and the object area, the optical integrator having an m-gonal (where m is an even number) sectional shape, forming multiple pairs of opposing reflection surfaces, and reflecting the beam between the multiple pairs of opposing reflection surfaces, wherein a length L in an axial direction of the reflection type optical integrator meets the following equations: $R=\Phi/[\tan\{\sin^{-1}(\sin\theta/n)\}]$; and $C\times(A-0.1)\times R \leq L \leq C\times(A+0.1) \times R$, where n is a refractive index of a medium between the reflection surfaces, $\Phi$ is a distance between the reflection surfaces, $\theta$ is an angle of divergence when the beam emitted from the condensing optical system enters the reflection type optical integrator, C is a constant determined in relation to the sectional shape of the reflection type optical integrator, and A is a natural number.

19 Claims, 7 Drawing Sheets

U.S. PATENT DOCUMENTS

| | | | |
|---|---|---|---|
| 6,139,156 A * | 10/2000 | Okamori et al. | 353/98 |
| 6,231,193 B1 * | 5/2001 | Sugawara | 353/102 |
| 6,236,449 B1 * | 5/2001 | Tanitsu | 355/67 |
| 6,259,557 B1 * | 7/2001 | Miyashita et al. | 359/387 |
| 6,285,855 B1 | 9/2001 | Tsuji | 399/618 |
| 6,307,682 B1 * | 10/2001 | Hoffman et al. | 359/663 |
| 6,333,777 B1 | 12/2001 | Sato | 355/53 |
| 6,377,336 B1 * | 4/2002 | Shiraishi et al. | 355/67 |
| 2001/0033433 A1 | 10/2001 | Shinoda | 359/798 |
| 2002/0001134 A1 | 1/2002 | Shinoda | 359/627 |

\* cited by examiner

ILLUMINATION APPARATUS, EXPOSURE APPARATUS USING THE SAME AND DEVICE FABRICATION METHOD

BACKGROUND OF THE INVENTION

The present invention relates generally to illumination optical systems, and more particularly to an illumination apparatus, an exposure apparatus, a device fabricating method, and a device fabricated from an object to be exposed or a target. The illumination apparatuses and exposure apparatuses are used to fabricate various devices such as single crystal plates for semiconductor wafers, glass plates for liquid crystal displays (LCD), and the like. The present Invention is suitably applicable, for example, to an illumination apparatus used for an exposure apparatus that exposes single crystal plates for semiconductor wafers in a micro-lithography process for fabricating minute patterns.

Along with the recent demand on smaller and lower profile electronic devices, minute semiconductor devices to be mounted onto these electronic devices have been increasingly demanded. For example, a design rule for a mask pattern requires that an image with a size of a line and space (L&S) of 0.1 $\mu$m or less be extensively formed, and predictably, it will further move to a formation of circuit patterns of 80 nm or less in the future. L&S denotes an image projected to a wafer in exposure with equal line and space widths, and serves as an index of exposure resolution.

A projection exposure apparatus, which is a typical exposure apparatus for fabricating semiconductor devices, includes a projection optical system that projects and exposes a pattern drawn on a mask or a reticle (which are used interchangeably in this application) onto a wafer. Resolution R of a projection exposure apparatus (a minimum size which enables a precise transfer of an image) can be given by using a light-source wavelength $\lambda$ and the number of apertures (NA) of the projection optical system as in the following equation:

$$R = k_1 \times \frac{\lambda}{NA} \quad (1)$$

Therefore, the shorter the wavelength becomes, and the higher the NA increases, the better the resolution becomes. In the meantime, a focusing range that maintains a desired image-forming performance is called a depth of focus (DOF), and the DOF is given in the following equation.

$$DOF = k_2 \times \frac{\lambda}{NA^2} \quad (2)$$

Therefore, the shorter the wavelength becomes, and the higher the NA increases, the smaller (shallower) the DOF becomes. A small DOF would make focus adjustment difficult, as well as requiring higher flatness for a plate and more precise focusing accuracy, and thus, a large DOF is basically desirable.

It can be understood from the equations (1) and (2) that in order to improve resolution while, on the other hand, preventing the DOF from becoming too small, a shortened wavelength will be more desirable than an increased NA. In recent years, a wavelength of an exposure light source is shifting from KrF excimer laser (with a wavelength of 248 nm) to ArF excimer laser (with a wavelength of 193 nm), and NA is from about 0.6 to 0.75. Further, a practical application of $F_2$ laser (with a wavelength of 157 nm) is being promoted as an exposure light source.

Another factor that affects resolution could be uniform illuminance on an illuminated plane. High-resolution patterns are unavailable without satisfactorily uniform illuminance on the illuminated plane. Accordingly, a known technique for improving uniform illuminance is to arrange an optical integrator between a light source and an object to be illuminated, and the optical integrator may be, for example, a wave front splitting type optical integrator (for example, a fly-eye lens, and such terms are used interchangeably in this application) and a reflection type optical integrator (which includes a glass rod and hollow pipe, and is also called an optical pipe, and such terms are used interchangeably in this application).

Japanese Laid-Open Patent Application No. 7-201730, for example, proposes a method for improving uniform illuminance on the illuminated plane using an optical pipe (or a glass rod) as a reflection type optical integrator, thus making the optical pipe's edge plane of exit conjugate with a reticle plane. This reference keeps variable an angle of divergence (or angle of convergence) of a beam entering the optical pipe by driving an optical system provided at a front stage of the optical integrator.

Further, the instant assignee uses an optical pipe as a reflection type optical integrator in Japanese Laid-Open Patent Application No. 10-270312, and proposes a method for improving the uniform illuminance on the illuminated plane by arranging an angle-of-exit maintaining optical element at a front stage of the optical pipe for introducing a beam to the pipe with a specific angle of divergence. The reference arranges the optical pipe's edge plane of exit conjugate with a pupil plane of a projection optical system, thus improving the uniform light intensity distribution (i.e., an effective light source) formed by a fly-eye lens at a subsequent stage of the optical pipe as well as promoting the improved uniform illuminance on the illuminated plane (i.e., a reticle plane or a wafer plane).

However, it has not yet been verified that an illumination apparatus with a conventional reflection type optical integrator actually illuminates the illuminated plane uniformly and effectively (in other words, with desired illuminance). Uneven illumination would cause an insufficient transfer of a pattern onto a resist, thus deteriorating quality of semiconductor wafers, LCDs, thin-film magnetic heads, and the like. Further, a throughput would be lowered without illuminated at high illuminance.

A uniform illumination distribution (or light intensity distribution) at the optical pipe's edge plane of exit requires a polygonal sectional shape of the optical pipe so as to increase the number of internal-surface reflections. This would need a small section of the optical pipe or a long optical pipe in an axial direction. Nevertheless, the smaller section would condense light so much, facing a limitation in optical member's durability. On the other hand, the longer optical pipe would undesirably cause an increased loss of an in-pipe light amount (e.g., a loss resulted from a transmittance of a glass material in case of a glass rod, and a loss resulted from reflection efficiency on a reflection surface in case of a hollow rod), and a larger-sized apparatus.

Moreover, as mentioned above, an exposure apparatus for fabricating minute patterns, such as a semiconductor device, has recently sought a shorter exposure wavelength. The shorter exposure wavelength would restrict available glass materials having sufficiently high transmittance and coating materials with high reflection efficiency. Thus, redundancy of an optical pipe would lower light utilization efficiency, disadvantageously deteriorating the throughput in the long run.

BRIEF SUMMARY OF THE INVENTION

Accordingly, it is an exemplary object of the present invention to provide a small-sized illumination apparatus with high light utilization efficiency by properly shortening the length of a reflection type optical integrator while making an illumination distribution at its edge plane of exit sufficiently even, as well as an exposure apparatus and a device fabricating method employing such an illumination apparatus.

In order to achieve the above object, an illumination apparatus, as an aspect of the present invention, for using a beam emitted from a light source to illuminate an object area includes a condensing optical system for condensing the beam emitted from the light source, and a reflection type optical integrator located between the condensing optical system and the object area, the optical integrator having an m-gonal (where m is an even number) sectional shape, forming multiple pairs of opposing reflection surfaces, and reflecting the beam between the multiple pairs of opposing reflection surfaces, wherein a length L in an axial direction of the reflection type optical integrator meets the following equations: $R=\Phi/[\tan\{\sin^{-1}(\sin\theta/n)\}]$, and $C\times(A-0.1)\times R \leq L \leq C\times(A+0.1)\times R$, where n is a refractive index of a medium between the reflection surfaces, $\Phi$ is a distance between the reflection surfaces, $\theta$ is an angle of divergence when the beam emitted from the condensing optical system enters the reflection type optical integrator, C is a constant determined in relation to the sectional shape of the reflection type optical integrator, and A is a natural number.

According to such an illumination apparatus, this equation determines the length L of the reflection type optical integrator, thereby providing stable reflections in the reflection type optical integrator and uniform illumination for the object area, as well as making the length L of the reflection type optical integrator shorter than the conventional one. As a result, such an illumination apparatus may provide uniform illumination, thus contributing to a miniaturization of the apparatus.

This illumination apparatus may set C=1 when the sectional shape of the reflection type optical integrator is square or rectangle, and C=1.05 or 1.15 when the sectional shape of the reflection type optical integrator is a regular hexagon.

In such an illumination apparatus, the condensing optical system may include a plurality of optical systems each having a different angle of divergence, and the optical systems can be switched in accordance with illumination conditions. Thereby, an angle of beam for entering an element located at the plane of exit of the reflective type optical integrator may be properly adjusted in compliance with illumination conditions. The condensing optical system may be structured such that it includes a zoom mechanism having a variable angle of divergence according to illumination conditions.

The illumination apparatus may further include an optical element between the light source and the condensing optical system, the optical element making an optical angular distribution approximately the same as an aspect ratio of the object area that is rectangular. Such an illumination can illuminate the rectangular illuminated area efficiently. The optical element may include an anamorphic optical system that has different focal distances in longitudinal and lateral directions in the rectangular object area. Of course, for simplicity purposes of the apparatus, the focal distances in the longitudinal and lateral directions may naturally be made the same. In case, it is preferable for illumination efficiency to set the focal distance in line with the lateral direction of the illumination area so as to prevent vignetting of the beam. The optical element may be a wave front splitting type optical integrator that splits a wave front of light of incidence to form multiple light sources at or near a plane of exit of light. The wave front splitting type optical integrator may include multiple optical elements having a different angle of divergence, and the optical elements may be made switchable according to illumination conditions.

An exposure apparatus as another aspect of this invention includes one of the above illumination apparatuses, and an optical system for projecting a pattern formed on a reticle or mask onto an object to be exposed. Such an exposure apparatus includes the above illumination apparatus, and thus exhibits similar operations.

A device fabricating method as still another aspect of this invention includes the steps of exposing the object by using the above exposure apparatus, and performing a specified process on the exposed object. Claims directed to the device fabricating method that exhibits operations similar to those of the above exposure apparatus cover devices as their intermediate products and finished products. Moreover, such devices include, e.g., semiconductor chips such as LSIs and VLSIs, CCDs, LCDs, magnetic sensors, thin-film magnetic heads, etc.

Other objects and further features of the present invention will become readily apparent from the following description of the embodiments with reference to accompanying drawings.

DETAILED DESCRIPTION OF THE PREFERRED EMBODIMENTS

Figure 1:
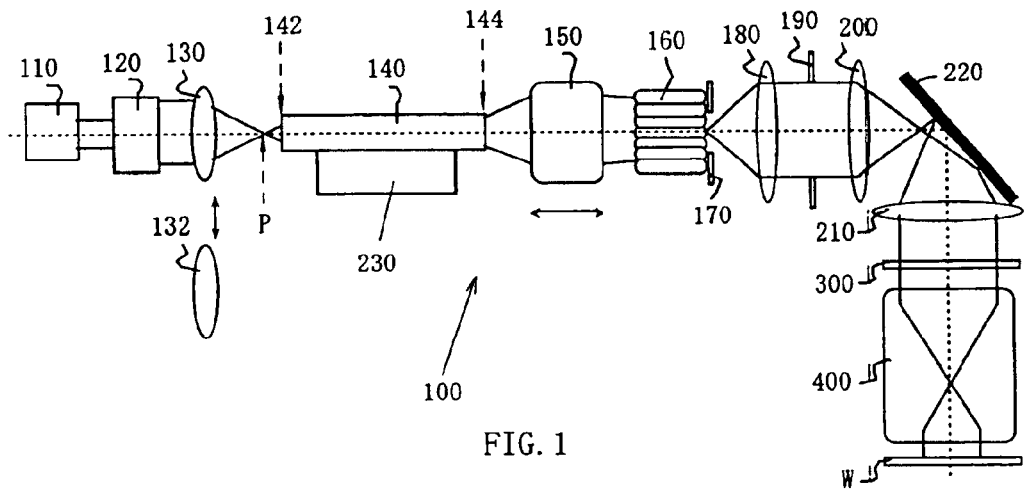
FIG. 1 is a schematic structural view of an exemplary exposure apparatus of the present invention and an illumination apparatus that is a part of it.

A description will now be given of an exemplary exposure apparatus 1 and illumination apparatus 100 of the present invention with reference to accompanying drawings. The same reference numeral in each figure denotes the same members. Here, FIG. 1 is a schematic block diagram of an exposure apparatus 1 and an illumination apparatus 100 of this invention that is a part of it.

As shown in FIG. 1, the exposure apparatus 1 includes the illumination apparatus 100, a mask 300, a projection optical system 400, and a controller (not shown). The exposure apparatus 1 is, for example, a scanning projection exposure apparatus that exposes onto a plate W a pattern formed on the mask 300 in a step-and-scan manner. However, the exposure apparatus of the present invention can be a step-and-repeat type exposure apparatus.

Typically, the illumination apparatus 100 includes a light source part, an illumination optical system, and a controller (not shown), thus illuminating the mask 300 on which a pattern to be transferred is formed.

The light source part includes a laser 110 and a beam shaping system 120, thus supplying the illumination optical system with illumination light.

The laser 110 is a light source that emits illumination light. While it is a $F_2$ laser with a wavelength of about 157 nm in this embodiment, it could be replaced by a ArF excimer laser with a wavelength of about 193 nm, a KrF laser with a wavelength of about 248 nm, or the like. Moreover, the light source can be, for example, an ultra-high pressure mercury lamp (g-line with a wavelength of about 436 nm, or i-line with a wavelength of about 365 nm), or a xenon lamp generally having an output of 500W or more.

The beam shaping system 120 can use, for example, a beam expander, etc., with a plurality of cylindrical lenses, and convert an aspect ratio of the size of the sectional shape of parallel beams from the laser 110 into a desired value (for example, by changing the sectional shape from a rectangle to a square), thus reshaping the beam shape to a desired one.

Preferably, the shaping system 120 uses an incoherently turning optical system, though it is not shown in FIG. 1, which turns a coherent laser beam into an incoherent one. The incoherently turning optical system may use an optical system that includes at least one return system, for example, as disclosed in FIG. 1 in Japanese Laid-Open Patent Application No. 3-215930, which splits an incident beam on a light splitting plane into at least two beams (e.g., p polarized light and s polarized light). The return system then provides one of them, relative to the other, with an optical path length difference more than the coherence length of a laser beam via an optical member, and subsequently leads it to the light splitting plane so that the superimposed light is emitted.

The illumination optical system is an optical system that uses light emitted from the laser 110 to illuminate the mask 300, and includes a condensing optical system 130, a reflection type optical integrator (optical pipe) 140, a condenser zoom lens 150, a wave front splitting type optical integrator (a fly-eye lens) 160, an aperture stop 170, and a condenser lens 180, a blade (a field stop) 190, image-forming lenses 200 and 210, a deflecting mirror 220, and a pipe drive mechanism 230 in this embodiment.

The condensing optical system 130 condenses light emitted from the beam shaping system 120 around the optical pipe 140's plane of incidence 142 (a condensing point P), and forms a beam with a specified angle of divergence for entering the optical pipe 140. The condensing optical system 130 is composed of at least one lens element, but may include a mirror for deflecting a light path if necessary. When the optical pipe is composed of a glass rod, a condensed point P by the condensing optical system 130 is preferably formed while defocused toward the light source side rather than the optical pipe 140's plane of incidence 142 so as to enhance the durability of the glass rod.

This embodiment enables the condensing optical system 130 to be switched to a condensing optical system 132 having a different angle of exit so as to properly adjust an angle of a beam entering the fly-eye lens 160 even when the condenser zoom lens 150 in the subsequent stage zooms. The condensing optical systems 130 and 132 may be switched, for example, by connecting the condensing optical systems 130 and 132 to a drive unit (not shown), and by linearly driving the drive unit so that the condensing optical elements 130 and 132 may cross the optical axis. However, the switching is not necessarily performed by this structure and method, but may be performed by any technique conceivable to those skilled in the art. Thus, a detailed description thereof will be omitted here. Although FIG. 1 shows only the condensing optical system 132 as a replaceable condensing optical system, this structure is just an example; the present invention may of course use a plurality of condensing optical systems with a different angle of exit. The reference numeral 130 in this specification generalizes the condensing optical system 132 and other condensing optical systems unless otherwise specified.

Figure 2:
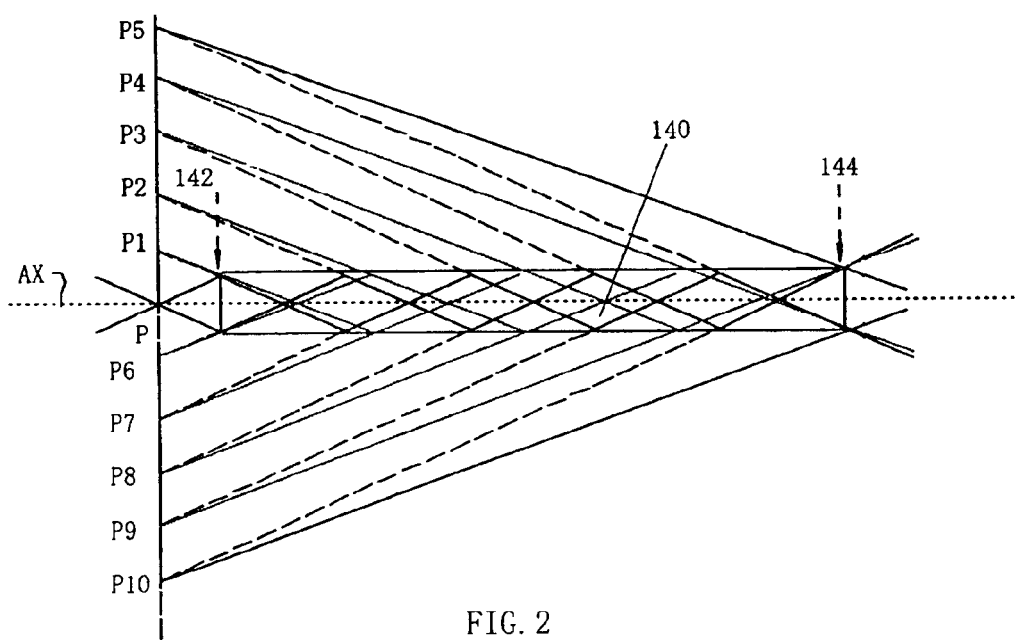
FIG. 2 is a typical view showing the optical integrator shown in FIG. 1 and an optical axis AX.

The optical pipe 140 make uniform, at its plane of exit, the light intensity distribution that is not uniform at its plane of incidence as a result of internal repetitive reflections of beams entering from the condensed point P with a specific angle of divergence. Referring to FIG. 2, the optical pipe 140 is preferably located slightly away from the focal point P, because an excimer laser beam used as a laser beam would cause the enormous energy density near the focal point P, possibly damaging the coating (i.e., anti-reflection coating) and glass material at the optical pipe's plane of incidence 142. Here, FIG. 2 is a schematic sectional view showing a neighborhood of the optical pipe 140 shown in FIG. 1 including the optical axis AX.

The optical pipe 140 in this embodiment forms multiple pairs of opposing reflection surfaces at a hexagonal sectional shape, and is made, for example, of a glass-molded hexagonal column rod. Of course, such a structure is exemplary, and thus does not intend to preclude an application of any material that exhibits a similar operation to this rod. For example, the optical pipe 140 may be made of a hollow rod forming internal reflection surfaces. The optical pipe 140 should be m-gonal (m: even number) in order to form multiple pairs of opposing reflection surfaces, and is not limited to a hexagon.

Figure 3:
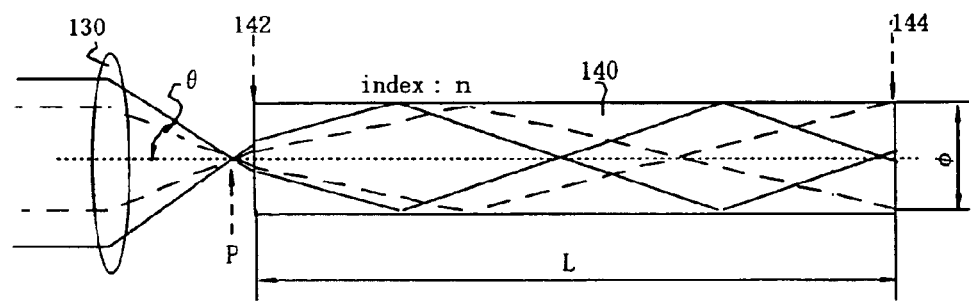
FIG. 3 is a typical view showing a positional relationship between a condensing optical system and an optical pipe shown in FIG. 1 as well as an optical path.
Figure 4:
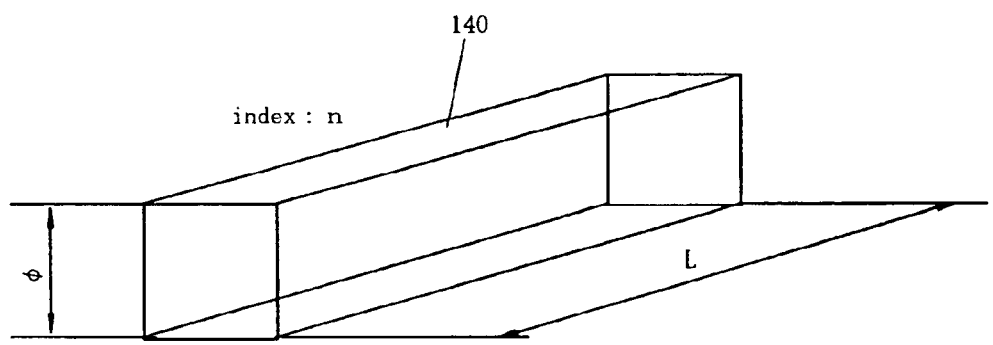
FIG. 4 is a schematic perspective view showing the optical pipe shown in FIG. 1.

Referring now to FIGS. 3 and 4, a detailed description will be given of the optical pipe 140. Here, FIG. 3 is a schematic side view showing a positional relationship between the condensing optical system 130 and the optical pipe 140 shown in FIG. 1 as well as the optical path. FIG. 4 is a schematic perspective view showing the optical pipe 140 shown in FIG. 1. For description purposes, it is assumed that the optical pipe 140 is a square column rod with a square sectional shape, and made of a glass rod with an index of refraction being n. An interval between opposing reflection surfaces in a square section is Φ (mm) and the length is L (mm). An angle of a beam entering the optical pipe 140 from the condensing optical system 130 (i.e., an angle of divergence angle) is θ (degrees).

An equation (3) below indicates a length R corresponding to one internal reflection in this optical pipe 140 for a beam that has entered the optical pipe 140:

$$R = \frac{\phi}{\tan\left\{\sin^{-1}\left(\frac{\sin\theta}{n}\right)\right\}} \quad (3)$$

n=1 for the optical pipe as a hollow rod. The equation (4) defines the number of reflections N of a beam in the optical pipe 140 having a length of L:

$$N = L/R \quad (4)$$

Generally, the number of reflections N may be made large to obtain a uniform illumination distribution at the optical pipe 140's plane of exit 144. This requires long L or reduced Φ, but would undesirably cause the above problem. On the other hand, the improved light utilization efficiency requires the short length L (to reduce the number of reflections N), but the inappropriately reduced number of reflections N would prevent optimization of the beam mixing, causing the following problems: First, the optical pipe 140's plane of exit 144 can hardly provide a uniform illumination distribution. In addition, any positional or angular offset in a beam entering the optical pipe 140 due to a decenter (such as a parallel offset, a rotary offset, etc.) between the condensing optical system 130 and optical pipe 140 would enlarge a change in illumination distribution at the optical pipe's plane of exit 144.

Here, the present invention uses a scale called "stability in illumination distribution" at the optical pipe 140's plane of exit 144 to handle these problems quantitatively. This term is used to express uniformity of illuminance and stability of distribution's barycenter at the optical pipe 140's plane of exit 144 when the decenter takes place.

The low "stability in illumination distribution" at the optical pipe's plane of exit 144 would lead to an asymmetrical effective light source distribution at the fly-eye lens 160. Undesirably, this would negatively affect a pattern image formation on the plate W. In Japanese Laid-Open Patent Application No. 7-201730, the low "stability in illumination distribution" at the optical pipe's plane of exit would deteriorate the illumination distribution at a surface to be exposed. An exposure apparatus is required to provide highly uniform illuminance at the surface to be exposed. Accordingly, such an exposure apparatus will separately require a mechanism for correcting a deteriorated illumination distribution, thus causing the apparatus to be more complicated. On the other hand, a filter when installed, as a mechanism for correcting the illumination distribution, near the optical pipe's plane of exit would lower the quantity of light and thus undesirably lower the throughput of the exposure apparatus.

Thus, it will be understood that the optical pipe 140 is required to have the length L short enough to provide the satisfactory "stability in illumination distribution" at the optical pipe's plane of exit 144.

Figure 5:
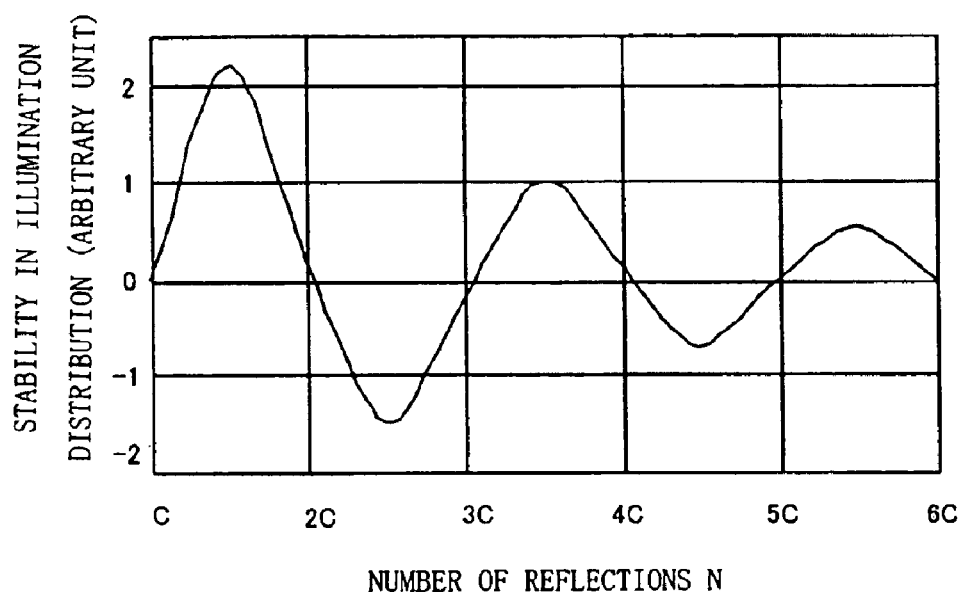
FIG. 5 is a graph showing the number of reflections N and stability in illumination distribution of the optical pipe's edge of exit.

Accordingly, referring to FIG. 5, a description will be given of a relationship between the number of reflections N in the optical rod 140 and the "stability in illumination distribution" at the optical pipe's plane of exit 144. Here, FIG. 5 shows the number of reflections N and the "stability in illumination distribution" at the optical pipe's plane of exit 144. An angle θ of a beam entering the optical pipe 140 is fixed relative to a distance Φ between the opposing reflection surfaces in the polygonal cross-section in the optical pipe 140. FIG. 5 sets the transverse axis to be the number of reflections N and the longitudinal axis to be the "stability in illumination distribution" using arbitrary unit. The "stability in illumination distribution" is in the best when its absolute value is 0, and becomes worse as the absolute value becomes larger.

As shown in FIG. 5, as the number of reflections N becomes larger, the "stability in illumination distribution" tends to converge with periodic fluctuations. In other words, there are discrete conditions that improve the "stability in illumination distribution" even with the small number of reflections N. The present inventors have discovered as a result of the optical simulation that these favorable conditions exist near (or within ±10% of) the products of natural numbers and a constant C. Thus, the condition of the number of reflections N that provides the good "stability in illumination distribution" can be expressed in the following equation:

$$C \times (A-0.1) \leq N \leq C \times (A+0.1) \quad (5)$$

where C is a constant, which is a positive real number determined by the optical rod and an angle θ of a beam of incidence. A is a coefficient, which is a natural number.

In other words, the optical pipe 140's length L that creates good "stability in illumination distribution" may be expressed in the following equation based on the equations (3)–(5):

$$C \times (A-0.1) \times R \leq L \leq C \times (A+0.1) \times R$$

$$R = \Phi/[\tan\{\sin^{-1}(\sin\theta/n)\}] \quad (6)$$

From the above, it will be understood that the length L and the diameter Φ of the optical pipe 140 are to be set for the good "stability in illumination distribution" so that the number of reflections N may meet the equation (6). The improved light utilization efficiency and a smaller apparatus would be available by selecting a small value for the coefficient A. Thus, a condition that provides the good "stability in illumination distribution" would successfully correct a positional offset in the effective light source distribution (i.e., without deforming the distribution), since the optical pipe's plane of exit 144 may almost keep the uniform illumination distribution even when the pipe drive mechanism 230, which will be described later, drives the optical pipe 140.

Turning back to FIG. 1, the condenser zoom lens 150 condenses light from the optical pipe 140 onto the fly-eye lens 160' plane of incidence. The condenser zoom lens 150 forms an image from the optical pipe 140's plane of exit 144 onto the fly-eye lens 160's plane of incidence under a specific magnification, and both are in an approximately conjugate relationship. In this embodiment, the condenser zoom lens 150 is a zoom lens with a variable magnification. The zoom lens 150 may adjust a range of a beam entering the fly-eye lens 160, and form multiple illumination conditions.

The fly-eye lens 160 serves to provide a uniform illumination to an object plane (a plane of the mask 300 and a plane of the plate W). The fly-eye lens 160 is a wave front splitting type optical integrator that splits a wave front of light of incidence and creates multiple light sources at or near a plane of exit. The fly-eye lens 160 emits light while converting an angular distribution of light of incidence into a positional distribution. The plane of incidence and the plane of exit on the fly-eye lens 160 are in a Fourier transformation relationship (the Fourier transformation relationship in the present specification optically means a relationship of a pupil plane and an object plane (or an image plane), and an object plane (an image plane) and a pupil plane.) Thus, the neighborhood of the fly-eye lens' plane of exit is a secondary light source (or effective light source). The fly-eye lens 160 is structured by combining many rod lenses (namely, minute lens elements) in this embodiment. However, the wave front splitting type optical integrator applicable to this invention is not limited to a fly-eye lens. It can be, for example, multiple sets of cylindrical lens array plates in which respective sets are arranged orthogonal to each other.

The aperture stop 170 is a variable aperture stop that shields disused light, thus creating a desired effective light source, and may use various stops having an ordinary circular aperture, an annular aperture, etc. In order to replace a variable aperture stop, a disc turret that formed such aperture stops 170 is prepared and a controller (not shown) may switch the apertures by turning the turret, for instance.

The condensing lens 180 is, for example, a condenser lens for condensing as many effective light sources formed near the fly-eye lens 160's plane of exit as possible, superimposing them on the blade 190, and Koehler-illuminating the blade 190.

The blade 190 limits an exposure range on the plane of the mask 300 as a plane to be illuminated (and thus the plate W). The blade 190 includes multiple mobile light blocking plates for forming an arbitrary aperture shape.

The image-forming lenses 200 and 210 are, for example, condenser lenses for transferring the aperture shape of the blade 190 onto the mask 300 as a plane to be illuminated.

The deflecting mirror 220 deflects light emitted from the image-forming lens 200 so that they may enter the image-forming lens 210 (and thus the mask 300). If the image-forming lens 210 is disposed parallel to the image-forming lens 200 in advance, the deflecting mirror 220 can be omitted. However, the deflecting mirror 220 in this structure will contribute to miniaturization of the apparatus.

The pipe drive mechanism 230 optimally adjusts a position of the effective light source by slightly driving the optical pipe 140 in a plane perpendicular to the optical axis or by tilting it around a position near the plane of incidence. More specifically, in setting multiple illumination conditions, the pipe drive mechanism 230, for example, optimally corrects, for each illumination condition, a positional offset of the effective light source caused by a driving error for the condenser zoom lens 150 and a positional error of the aperture stop 170. The pipe drive mechanism 230 is connected to the optical pipe 140 directly or indirectly, as well as to a controller (not shown) electrically. The pipe drive mechanism 230 may apply any known technique that can realize the above operations, and thus a detailed description thereof will be omitted herein.

The controller (not shown) typically includes a CPU and memory, and controls the illumination apparatus 100. The controller is electrically connected to a switching mechanism (not shown) of the condensing optical system 130, the condenser zoom lens 150, the variable aperture stop 170, the blade 190, and the pipe drive mechanism 230 (or via a controller or drive mechanism of each component). In this embodiment, the controller appropriately changes the switching mechanism of the condensing optical system 130, the condenser zoom lens 150, the aperture shapes of the aperture stop 170 and the blade 190, and the position of the optical pipe 140 according to illumination conditions. The controller of the illumination apparatus 100 may be functionally replaced with a control unit (not shown) of the exposure apparatus 1 described later, and the controller may be removed from the illumination apparatus 100 in such a structure.

The CPU includes any processors such as MPU or whatever the name may be, thus controlling operations of each component. The memory includes a ROM and RAM, and stores firmware for activating the illumination apparatus 100. The controller in the illumination apparatus 100 is not limited to the above structure only when it may achieve the above functions, and naturally may apply any technique conceivable to those skilled in the art.

The mask 300 is made, for example, of quartz, on which a circuit pattern (or an image) to be transferred is formed, and supported and driven by a mask stage (not shown). Diffracted light emitted from the mask 300 is projected onto the plate W through the projection optical system 400. The plate W is an object to be exposed, onto which resist is applied. The mask 300 and the plate W are located in an optically conjugate relationship. The exposure apparatus 1 in this embodiment is a step-and-scan type exposure apparatus (namely, a scanner), and therefore, scans the mask 300 and the plate W to transfer a pattern on the mask 300 onto the plate W. When it is a step-and-repeat type exposure apparatus (i.e., "a stepper"), the mask 300 and the plate W are kept stationary for exposure.

The mask stage supports the mask 300, and is connected to a transport mechanism (not shown). The mask stage and the projection optical system 400 are installed on a stage tube stool supported via a damper, etc. on the base frame placed on the floor, etc. The mask stage may use any structure known in the art. The transport mechanism (not shown) is made of a linear motor and the like, which drives the mask stage in a direction orthogonal to the optical axis, thus moving the mask 300. The exposure apparatus 1 uses a control unit (not shown) to scan the mask 300 and the plate W in a synchronous state.

The projection optical system 400 forms, onto the plate W, an image from beams that have passed through the pattern formed on the mask 300. The projection optical system 400 may use an optical system including only a plurality of lens elements, an optical system comprised of a plurality of lens elements and at least one concave mirror (a catadioptric optical system), an optical system comprised of a plurality of lens elements and at least one diffractive optical element such as a kinoform, and a full mirror type optical system, and so on. Any necessary correction of the chromatic aberration may use a plurality of lens units made from glass materials having different dispersion values (Abbe values), or arrange a diffractive optical element such that it disperses in a direction opposite to that of the lens unit.

The plate W is a wafer in this embodiment, but may include a liquid crystal plate and a wide range of other objects to be exposed. Photoresist is applied onto the plate W. A photoresist application step includes a pretreatment, an adhesion accelerator application treatment, a photo-resist application treatment, and a pre-bake treatment. The pretreatment includes cleaning, drying, etc. The adhesion accelerator application treatment is a surface reforming process so as to enhance the adhesion between the photo resist and a base (i.e., a process to increase the hydrophobicity by applying a surface active agent), through a coat or vaporous process using an organic film such as HMDS (Hexamethyldisilazane). The pre-bake treatment is a baking (or burning) step, softer than that after development, which removes the solvent.

The plate W is supported by a wafer stage (not shown). The wafer stage may use any structure known in the art, and thus, a detailed description of its structure and operations will be omitted here. For example, the wafer stage uses a linear motor to move the plate W in a direction orthogonal to the optical axis. The mask 300 and plate W are, for example, scanned synchronously, and the positions of the mask stage and wafer stage are monitored, for example, by a laser interferometer and the like, so that both are driven at a constant speed ratio. The wafer stage is installed on a stage stool supported on the floor and the like, for example, via a dumper, and the mask stage and the projection optical system 400 are installed on a stage stool (not shown) supported, for example, via a dumper to the base frame placed on the floor and the like.

The wafer stage moves the plate W in the direction of the optical axis within a range of the depth of focus, thus adjusting the image-forming position of the plate W. The exposure apparatus 1 performs a number of exposure operations for the plate 400 disposed in different positions to the direction of the optical axis, thereby eliminating dispersions in the image-forming performance within the depth of focus. Such a feature may use any techniques known in the art such as a rack (not shown) extensible in the direction Z, a pinion (not shown) connected to the wafer stage and mobile on the rack, a means for rotating the pinion and the like, and thus, a detailed description thereof will be omitted herein.

A control unit (not shown) typically includes a CPU and memory, and controls the exposure apparatus 1. The control unit is electrically connected to the illumination apparatus 100, the mask stage (not shown), and the wafer stage (not shown). In this embodiment, the control unit appropriately changes and moves the illumination apparatus 100, the mask stage, and the wafer stage in accordance to an exposure operation. The CPU may include any processors such as MPU or whatever the name may be, and controls operations of each component. A memory includes a ROM and RAM, and stores firmware for activating the exposure apparatus 1. The control unit of the exposure apparatus is not limited to the above structure only when it can achieve the above functions, and naturally apply any technique conceivable to those skilled in the art.

Figure 6:
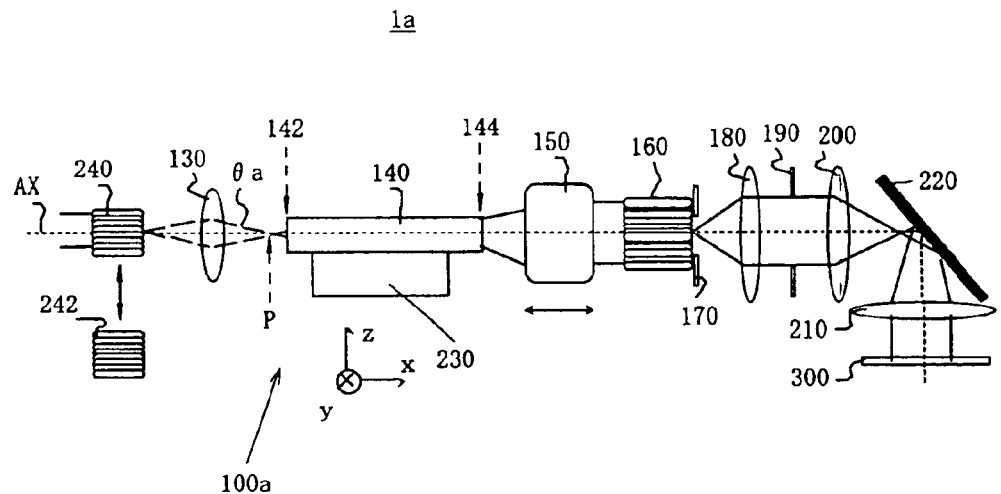
FIG. 6 is a side view showing part of an illumination apparatus as a variation of the illumination apparatus shown in FIG. 1.
Figure 7:
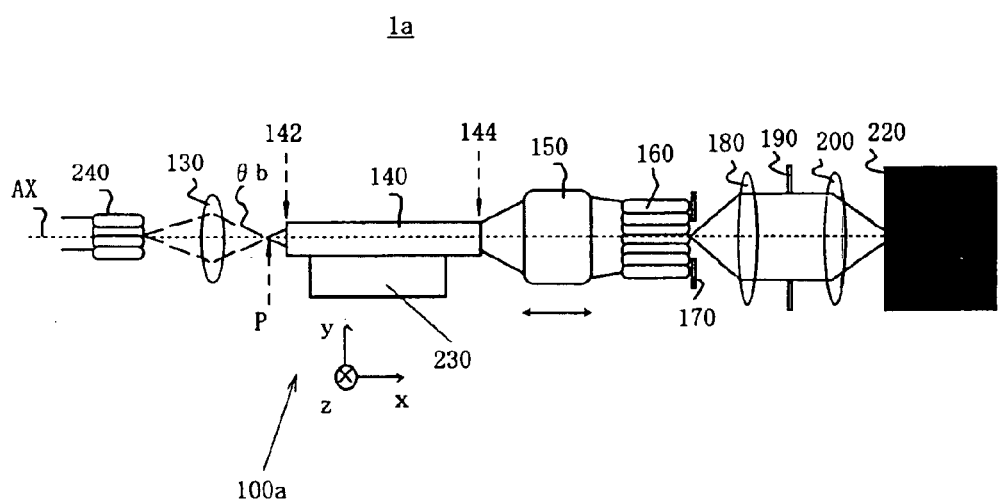
FIG. 7 is another side view showing part of the illumination apparatus shown in FIG. 6 that has rotated by 90° with respect to the optical axis.

Referring now to FIGS. 6 and 7, a description will be given of an exposure apparatus 1a and an illumination apparatus 100a as a variation of the exposure apparatus 1 and illumination apparatus 100, respectively. Here, FIG. 6 is a side view showing a variation of the exposure apparatus 1 shown in FIG. 1 and part of the illumination apparatus 100 that is a part of the exposure apparatus 1. FIG. 7 is another side view showing part of the illumination apparatus 100a when the exposure apparatus shown in FIG. 6 is rotated by 90° around the optical axis. The structurally same element as that in the above exposure apparatus 1 and illustration apparatus 100 uses the same reference numeral, and a duplicate description thereof will be omitted.

A step-and-scan (scan) exposure apparatus usually exposes by scanning the mask 300 and the plate W synchronously, and thus an illumination area is short in the scan direction while the illumination area orthogonal to the scan direction is long in an exposed plane. FIG. 6 shows the illumination apparatus 100a in a direction (called "z direction" hereinafter) illuminating the scan (lateral) direction, whereas FIG. 7 shows the illumination apparatus 100a in the direction (called "y direction" hereinafter) illuminating the longitudinal direction. A section including an axis extending from the optical axis AX in the y direction is called an xy section, and a section including the axis extending from the optical axis AX in the z direction is called an xz section.

The illumination apparatus 100a in the exposure apparatus 1a as a variation arranges an angle-of-exit maintaining optical element 240 in the subsequent stage of the beam shaping system 120 (not shown) in the illumination apparatus 100 in the exposure apparatus 1.

The angle-of-exit maintaining optical system 240 emits beams with different angles of exit θa and θb at the xz section in FIG. 6 and the xy section in FIG. 7. The step-and-scan projection exposure apparatus 1a needs to effectively form on the plane of the mask 300 a slit-shaped illumination area that is longer in the z direction than in the y direction, and thus θa is adapted to be smaller than θb. As a result, beams at respective sections have different open angles, and a desired slit-shaped illumination area is formed effectively.

This embodiment uses as the angle-of-exit maintaining optical element 240 an optical element made of an anamorphic optical system having different focal distances in the xz and xy sections. For example, the angle-of-exit maintaining optical element 240 can use a fly-eye lens which two-dimensionally arranges, along the yz section, a plurality of minute lenses having different focal distances in the xz and xy sections, or an optical system which arranges (an array of) cylindrical lenses with different focal distances in the xy and xz sections. Minute lenses forming each fly-eye lens may be composed of ordinary lenses and diffractive optical elements (Fresnel lenses).

The angle-of-exit maintaining optical element 240 properly adjusts an angle of a beam entering the fly-eye lens 160 even when the condenser zoom lens 150 in the subsequent stage zooms, and thus is adapted to be switched to another angle-of-exit maintaining optical element 242 that has a different angle of exit. Such a switching mechanism may apply a structure similar to the above condensing optical system 130, and thus a detailed description thereof will be omitted here.

A description will be given of a result of optimum conditions of the optical pipe 140 calculated based on an optical simulation in the illumination apparatus 100a having such a structure.

Firstly, when the optical pipe 140 is a square pole and the angle-of-exit maintaining optical element 240 has a combination of bi-directional cylindrical lenses (arranged orthogonal to each other so that an angle of exit may be defined only in the x and y directions), the optimum condition is the constant C=1. However, the distribution at the pipe's plane of exit does not become uniform where A=1, and therefore the effective number of reflections N is about A times in the exposure apparatus 1a (A: natural number equal to or greater than 2). Therefore, the number of reflections N in the optical pipe 140 having such a structure will meet the following equation:

$$(A-0.1) \leq N \leq (A+0.1) \tag{7}$$

where A is a natural number equal to or greater than 2.

Secondly, when the optical pipe 140 is a hexagonal column and the angle-of-exit maintaining optical element 240 has a combination of X-direction cylindrical lens and Y-direction cylindrical lenses (two cylindrical lens arrays arranged orthogonal to each other so that an angle θ of exit may be defined only in the x and y directions), and when one side of the optical rod 140 is brought in line with either the x or y direction, i.e., when an angle between them is zero), the optimum condition is the constant C=1.15. However, the distribution at the pipe's plane of exit cannot become uniform where A=1, and therefore the effective number of reflections N is about A times in the exposure apparatus 1a (A is a natural number equal to or greater than 2). Therefore, the number of reflections N in the optical pipe 140 having such a structure will meet the following equation:

$$1.15 \times (A-0.1) \leq N \leq 1.15 \times (A+0.1) \quad (8)$$

where A is a natural number equal to or greater than 2.

When the above angle θ is 15° (clockwise or counterclockwise), the number of reflections N will meet the following equation:

$$1.05 \times (A-0.1) \leq N \leq 1.05 \times (A+0.1) \quad (9)$$

where A is a natural number equal to or greater than 2.

Thirdly, when the optical pipe 140 is a hexagonal column and the angle-of-exit maintaining optical element 240 is a fly-eye lens including minute lenses each having a hexagonal aperture, the optimum condition is the constant C=1.15. However, the distribution at the pipe's plane of exit cannot become uniform where A=1, and therefore the effective number of reflections N is about A times in the exposure apparatus 1a (A is a natural number equal to or greater than 2). Therefore, the number of reflections N in the optical pipe 140 having such a structure will meet the following equation:

$$1.15 \times (A-0.1) \leq N \leq 1.15 \times (A+0.1) \quad (10)$$

where A is a natural number equal to or greater than 2.

The inventive exposure apparatus 1a and the illumination apparatus 100a as part of it have a small angle of incidence θa corresponding to the lateral direction of the illumination area, and therefore the condition that provides the good "stability in illumination distribution" of the optical pipe's plane of exit 144 is calculated from the equation (5) using θa. It is similarly preferable that an angle of incidence θb corresponding to the longitudinal direction of the illumination area provides the condition that provides the good "stability in illumination distribution". However, as understood from FIG. 5, the stability in illumination distribution converges in a good state for the sufficient number of reflections, and thus the equation (5) would not necessarily be satisfied.

Thus, the present invention may improve the light utilization efficiency, providing an illumination apparatus with better "stability in illumination distribution" while attempting to miniaturize the apparatus. Although the exposure apparatus 1a uses the optical pipe 140 having the square section and different angles of incident light in the xy and xz sections, the optical pipe 140 may be an m-gonal column (m: even number) such as a hexagon, an octagon, etc., or it may be a quadratic column with a sectional shape of a rectangle. There are various angular conditions for entering optical pipes 140 and many combinations, but, at any rate, the equation (4) defines the condition that provides the "stability in illumination distribution". In other words, the optimum number of reflections (or an optimal length of the optical pipe) may be set by adjusting an angle θ of incident light according to a distance Φ between opposing surfaces in an m-gonal section (m: even number), and by calculating the constant C according to the combination.

Figure 8:
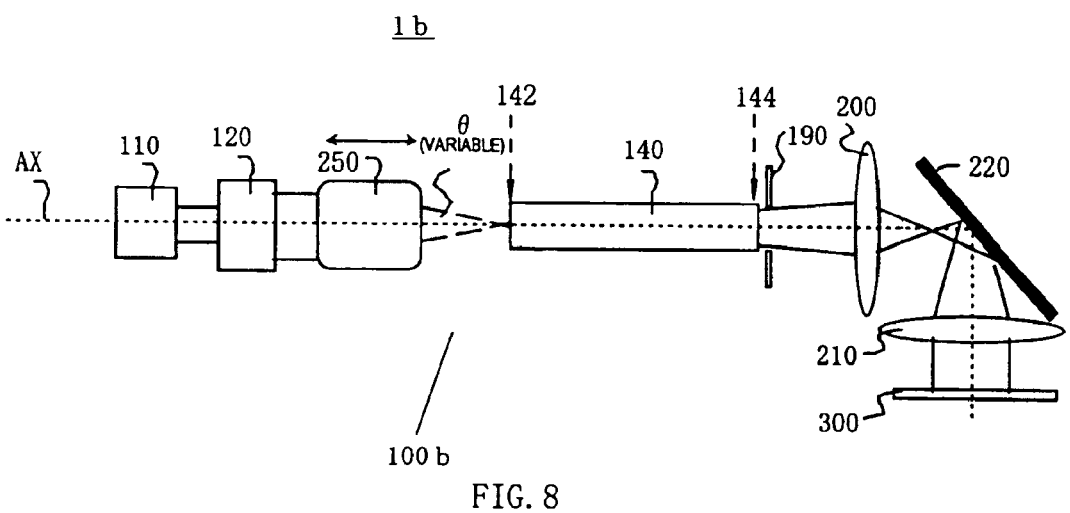
FIG. 8 is a side view showing part of an illumination apparatus as a variation of the illumination apparatus shown in FIG. 1.

Referring now to FIG. 8, a description will be given of the exposure apparatus 1b and the illumination apparatus 100b as a variation of the exposure apparatus 1 and illumination apparatus 100 shown in FIG. 1. Here, FIG. 8 is a side view showing a variation of the exposure apparatus 1 shown in FIG. 1 and the illumination apparatus 100. The structurally same element in the above exposure apparatus 1 and the illustration apparatus 100 uses the same reference numeral, and a duplicate description thereof will be omitted.

The illumination apparatus 100b of the exposure apparatus 1b as a variation includes a condenser zoom lens 250, the reflection type optical integrator (optical pipe) 140, the blade 190, the image-forming lenses 200 and 210, and the reflecting mirror 220 in its illumination optical system. The illumination apparatus 100b differs from the illumination apparatuses 100 and 100a in that it includes the condenser zoom lens 250.

The condenser zoom lens 250 guides light from the beam shaping system 120 in the preceding stage to the optical pipe 140 at a desired angle of divergence (or angle of convergence) θ. The optical pipe's plane of exit 144 is located at a position approximately conjugate with the plane of the mask 300 by the image-forming lenses 200 and 210. Therefore, the uniform illumination distribution should be stably maintained at the optical pipe 140's plane of exit 144 for the uniform illuminance at a plane to be exposed (mask 300 or plate W).

The condenser zoom lens 250 can use a zooming mechanism to arbitrarily adjust the angle of divergence (or angle of convergence) θ to the optical pipe 140, and realize a continuously variable distribution on a pupil plane in the projection optical system 400 (or an effective light source distribution). However, the variable angle of divergence (or angle of convergence) would change the number of reflections in the optical pipe 140. In other words, in connection with FIG. 5, the "stability in illumination distribution" of the optical pipe's plane of exit 144 fluctuates between the favorable and the unfavorable per zoom. Such a fluctuation tends to converge as the number of reflections grows bigger, and thus, in order to make the "stability in illumination distribution" favorable across the whole zooming area, it may be a plausible way to make the optical pipe 140 long enough, but if the light utilization efficiency is considered, the optical pipe needs to be appropriately short.

Accordingly, under the condition that the variable angle of divergence (angle of convergence) becomes smallest at the condenser zoom lens 240, the length of the optical pipe 140 in FIG. 8 is set to provide the good "stability in illumination distribution" in the plane of exit 144. As the zoom increases the angle of divergence (angle of convergence), the "stability in illumination distribution" deteriorates to some extent, but may fabricate devices unless the deterioration is problematic to the driving apparatus.

A description will now be given of the exposure operations using the exposure apparatus 100. During exposure, a beam emitted from the laser 110 is reshaped into a desired beam shape by the beam shaping system 120, and then enters the condensing optical system 130. The laser beam from the condensing optical system 130 condenses to the focus P (and forms an image) once, and enters, as a divergent beam having an angle of divergence θ, the optical pipe 140.

Referring to FIG. 2, the beam that has entered the optical pipe 140 repeats reflections (so-called total reflections), and passes through it. When the optical pipe has an m-gonal section (m: even number), the beam repeats reflections between opposing reflection surfaces and exits from the optical pipe 140 while keeping the angle of incidence. At this time, beams reflected by the respective internal reflection surfaces in the optical pipe 140 form virtual images P1, P2, P3, P4, P5, P6, P7, P8, P9, and P10, as shown by dotted lines, in the back. Although not shown, a hexagonal glass rod further forms a group of virtual images similar to the above using operations of the remaining two pairs of internal reflection surfaces. Therefore, in the optical pipe's plane of exit 144, numerous beams superimpose one another, as if these numerous virtual images had emitted beams, providing the uniform illumination distribution. As explained above, the optical pipe in this embodiment can provide the good "stability in illumination distribution" with the optimal length L for uniform illumination to the object area and miniaturization of the apparatus.

The optical pipe 140's plane of exit uses the condenser zoom lens 150 to form an image at the fly-lens 160's plane of incidence under a specified magnification. The fly-eye lens 160 transmits the aperture stop 170, and provides uniform illumination to the stop 190 via the condenser lens 180. Light, which has passed through the stop 190, illuminates the plane of the mask 300 through the condensing optical systems 200 and 210.

The beams having passed the mask 300 are demagnified and projected under a specific magnification onto the plate W by the image-forming operation of the projection optical system 400. The step-and-scan exposure apparatus 1 would fix the light source part and the projection optical system 400, and synchronously scan the mask 300 and plate W to expose the entire shot. The wafer stage for the plate W is then stepped to the next shot to expose and transfer a large number of shots on the plate W. If the step-and-repeat exposure apparatus 1 would expose keeping the mask 300 and plate W stationary.

The exposure apparatus 1 of the present invention improves the uniformity of the light intensity distribution (or effective light source) produced by the fly-eye lens 160 following the optical pipe 140, as well as contributing to the improved uniform illuminance at a plane to be illuminated (i.e., a reticle plane or wafer plane). Therefore, the exposure apparatus 1 can transfer a pattern onto the resist with high accuracy, thus providing high quality devices (such as semiconductor devices, LCD devices, image pick-up devices (such as CCDs, etc.), thin-film magnetic heads, and the like).

Figure 9:
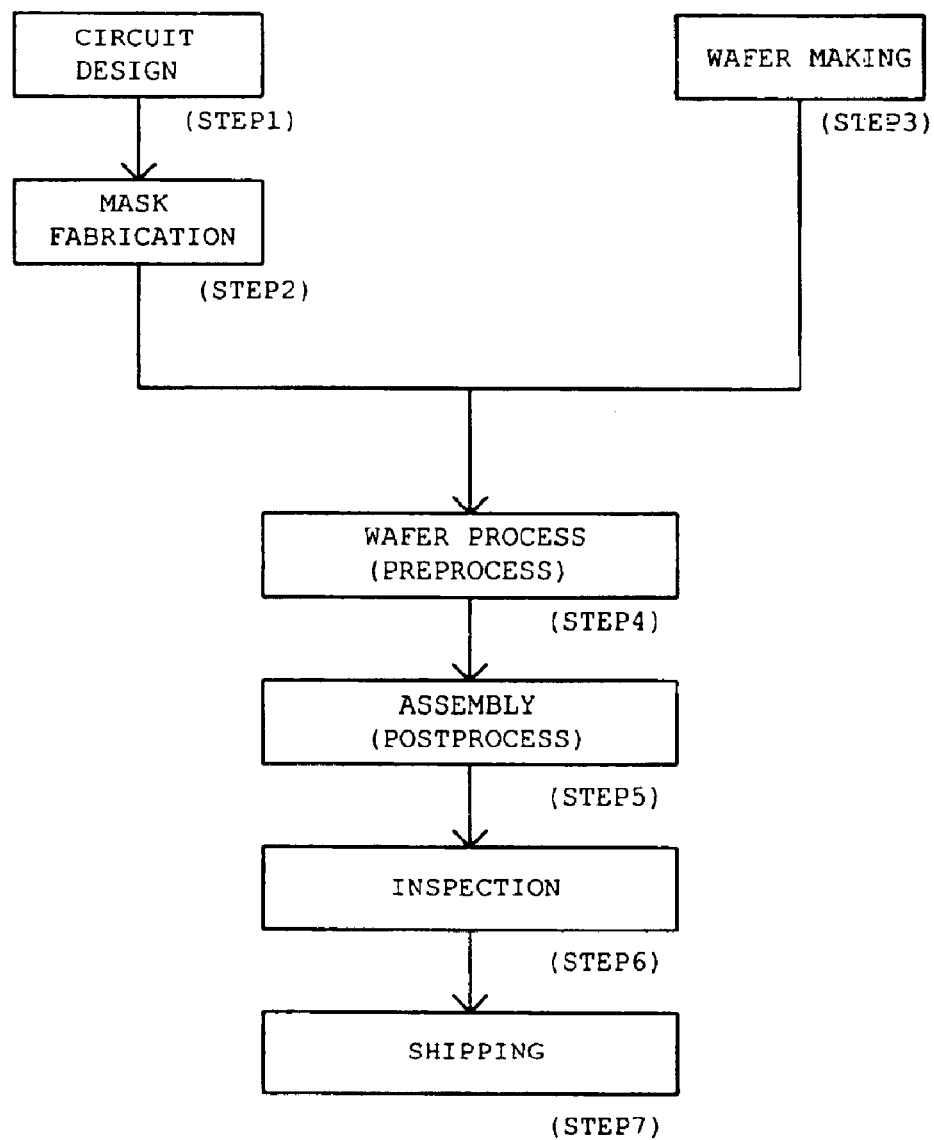
FIG. 9 is a flowchart for explaining a fabrication of devices (such as semiconductor chips such as ICs, LSIs and the like, LCDs, CCDs, etc.).
Figure 10:
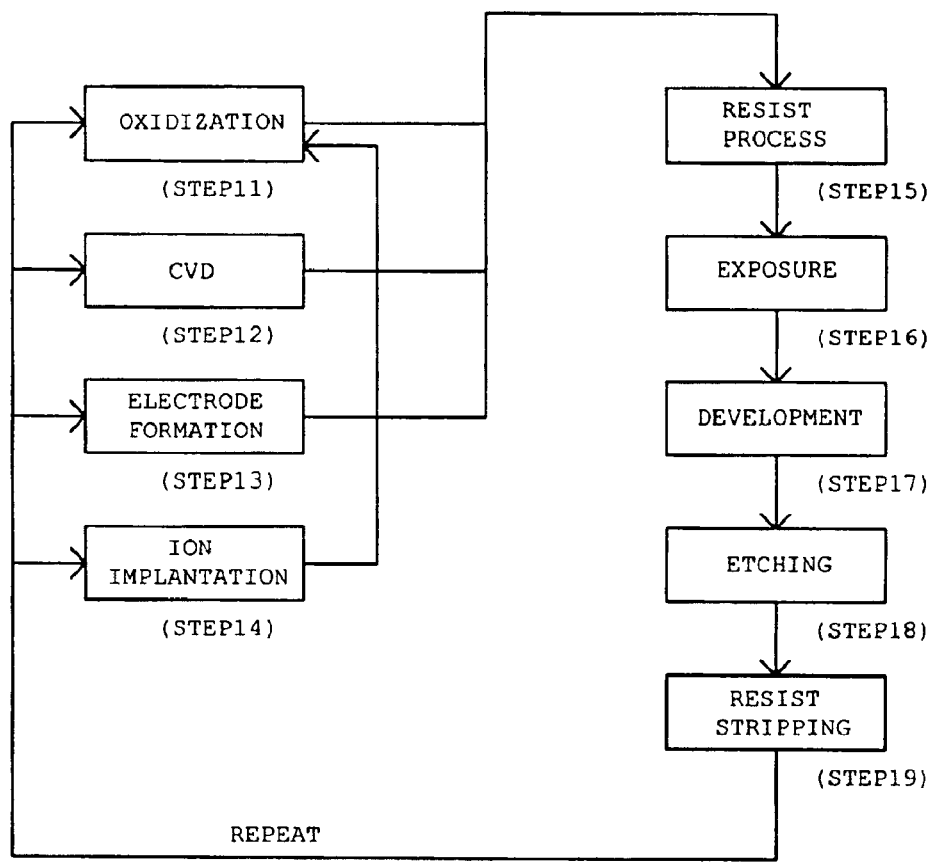
FIG. 10 is a detailed flowchart for Step 4 shown in FIG. 9.

Referring to FIGS. 9 and 10, a description will now be given of an embodiment of a device fabricating method using the above-mentioned exposure apparatus 1. FIG. 9 is a flowchart for explaining how to fabricate devices (i.e., semiconductor chips such as IC and LSI, LCDs, CCDs). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is also referred to as a pretreatment, forms actual circuitry on the wafer through photolithography of the present invention using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 10 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 1 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multi-layer circuit patterns are formed on the wafer.

Further, the present invention is not limited to these preferred embodiments, and various modifications and changes may be made without departing from the spirit and scope thereof.

The optimal calculations of a shape of an optical pipe and an angle of a beam entering the pipe under inventive conditions would satisfactorily provide the uniform illumination distribution and the decenter-resistant stability at the pipe's plane of exit. In addition, the properly shortened length of the pipe may realize a small-sized, highly efficient and high-performance illumination apparatus, an exposure apparatus that employs it, and a device fabrication method.

What is claimed is:

1. An illumination apparatus for using a beam emitted from a light source to illuminate an object area, said illumination apparatus comprising:

a condensing optical system for condensing the beam emitted from the light source; and a reflection type optical integrator located between said condensing optical system and the object area, said optical integrator having an m-gonal (where m is an even number) sectional shape, forming multiple pairs of opposing reflection surfaces, and reflecting the beam between the multiple pairs of opposing reflection surfaces, wherein a length L in an axial direction of said reflection type optical integrator meets the following equations:

$R = \Phi/[\tan\{\sin^{-1}(\sin\theta/n)\}]$; and $C \times (A-0.1) \times R \leq L \leq C \times (A+0.1) \times R$, where n is a refractive index of a medium between the reflection surfaces, $\Phi$ is a distance between the reflection surfaces, $\theta$ is an angle of divergence when the beam emitted from said condensing optical system enters the reflection type optical integrator, C is a constant determined in relation to the sectional shape of said reflection type optical integrator, and A is a natural number.

2. An illumination apparatus according to claim 1, wherein C=1 when the sectional shape of the reflection type optical integrator is square or rectangle.

3. An illumination apparatus according to claim 1, wherein C=1.05 or 1.15 when the sectional shape of the reflection type optical integrator is a regular hexagon.

4. An illumination apparatus according to claim 1, wherein said condensing optical system comprises a plurality of optical systems each having a different angle of divergence, and the optical systems can be switched in accordance with illumination conditions.

5. An illumination apparatus according to claim 1, further comprising an optical element between the light source and said condensing optical system, said optical element making an optical angular distribution approximately the same as an aspect ratio of the object area that is rectangular.

6. An illumination apparatus according to claim 5, wherein said optical element includes an anamorphic optical system that has different focal distances in longitudinal and lateral directions in the rectangular object area.

7. An illumination apparatus according to claim 5, wherein the optical element is a wave front splitting type optical integrator that splits a wave front of light of incidence to form multiple light sources at or near a plane of exit of light.

8. An illumination apparatus according to claim 1, further comprising an optical element between the light source and said condensing optical system, said optical element setting an optical angular distribution in accordance with a lateral direction of the object area that is rectangular.

9. An illumination apparatus according to claim 8, wherein the optical element is a wave front splitting type optical integrator that splits a wave front of light of incidence to form multiple light sources at or near a plane of exit of light.

10. An illumination apparatus according to claim 9, wherein the wave front splitting type optical integrator includes a plurality of optical elements each having a different angle of divergence, and the optical element can be switched in accordance with illumination conditions.

11. An illumination apparatus according to claim 1, wherein said condensing optical system includes a zooming mechanism having a variable angle of divergence in accordance with illumination conditions.

12. An illumination apparatus according to claim 1, further comprising a moving mechanism for moving said reflection type optical integrator within a plane perpendicular to an optical axis of the beam.

13. An illumination apparatus according to claim 1, further comprising a drive mechanism for driving said reflection type optical system by tilting said reflection type optical system around a position near a plane of incidence.

14. An exposure apparatus comprising:
  an illumination apparatus for using a beam emitted from a light source to illuminate a reticle or mask, said illumination apparatus comprising a condensing optical system for condensing the beam emitted from the light source, and a reflection type optical integrator located between said condensing optical system and the reticle or mask, said optical integrator having an m-gonal (where m is an even number) sectional shape, forming multiple pairs of opposing reflection surfaces, and reflecting the beam between the multiple pairs of opposing reflection surfaces, wherein a length L in an axial direction of said reflection type optical integrator meets the following equations: $R=\Phi/[\tan\{\sin^{-1}(\sin\theta/n)\}]$, and $C\times(A-0.1)\times R \leq L \leq C\times(A+0.1) \times R$, where n is a refractive index of a medium between the reflection surfaces, $\Phi$ is a distance between the reflection surfaces, $\theta$ is an angle of divergence when the beam emitted from said condensing optical system enters the reflection type optical integrator, C is a constant determined in relation to the sectional shape of said reflection type optical integrator, and A is a natural number; and
  an optical system for projecting a pattern formed on the reticle or mask onto an object to be exposed.

15. An exposure apparatus according to claim 14, wherein C=1 when the sectional shape of the reflection type optical integrator is square or rectangle.

16. An exposure apparatus according to claim 14, wherein C=1.05 or 1.15 when the sectional shape of the reflection type optical integrator is a regular hexagon.

17. A device fabricating method comprising the steps of:
  exposing an object by using an exposure apparatus comprising an illumination apparatus for using a beam emitted from a light source to illuminate a reticle or mask, said illumination apparatus comprising a condensing optical system for condensing the beam emitted from the light source, and a reflection type optical integrator located between said condensing optical system and the reticle or mask, said optical integrator having an m-gonal (where m is an even number) sectional shape, forming multiple pairs of opposing reflection surfaces, and reflecting the beam between the multiple pairs of opposing reflection surfaces, wherein a length L in an axial direction of said reflection type optical integrator meets the following equations: $R=\Phi/[\tan\{\sin^{-1}(\sin\theta/n)\}]$, and $C\times(A-0.1)\times R \leq L \leq C\times(A+0.1) \times R$, where n is a refractive index of a medium between the reflection surfaces, $\Phi$ is a distance between the reflection surfaces, $\theta$ is an angle of divergence when the beam emitted from said condensing optical system enters the reflection type optical integrator, C is a constant determined in relation to the sectional shape of said reflection type optical integrator, and A is a natural number, and an optical system for projecting a pattern formed on the reticle or mask onto an object to be exposed; and
  performing a predetermined process for the exposed object.

18. A device fabricating method according to claim 17, wherein C=1 when the sectional shape of the reflection type optical integrator is square or rectangle.

19. A device fabricating method according to claim 17, wherein C=1.05 or 1.15 when the sectional shape of the reflection type optical integrator is a regular hexagon.

* * * * *